Nov. 24, 1964 R. J. HASENAUER, JR 3,158,421

ELECTRICAL CONNECTOR FOR A PRINTED CIRCUIT BOARD AND CABLE

Filed Dec. 4, 1961

INVENTOR.
RAYMOND J. HASENAUER, JR.

BY Samuel R. Genca

AGENT

United States Patent Office 3,158,421
Patented Nov. 24, 1964

3,158,421

ELECTRICAL CONNECTOR FOR A PRINTED CIRCUIT BOARD AND CABLE

Raymond J. Hasenauer, Jr., Rochester, N.Y., assignor to General Dynamics Corporation, Rochester, N.Y., a corporation of Delaware Filed Dec. 4, 1961, Ser. No. 156,612
8 Claims. (Cl. 339—176)

This invention relates to a printed circuit board electrical connector and, more particularly, to a new and useful universal electrical connector for connecting individual lead wires and a flexible multiconductor cable to corresponding electrical contact elements disposed on one or both sides of one edge of a printed circuit board and a method for making an electrical connector.

Chassis layouts for electrical equipment become more complex as the circuits of the equipment become more complex. For the purpose of manufacture and servicing, it has been proposed that components be judiciously grouped and separately packaged on printed circuit boards and printed circuit board electrical connectors be used for bringing these packages, or "modules," into cooperative electrical relationship.

Although the present invention is suited for more general applications, it is particularly adapted for equipment having a large number of similar or repetitive subassemblies, as in telephone stations employing such techniques and circuit arrangements. In such equipment, it is desirable to bring the packages, or modules, into cooperative electrical relationship by lead wires and cable and, more specifically, with a multiconductor, flexible flat cable, the multiconductor flat cables being particularly desirable because of their low capacitance between adjacent coplanar conductors therein. In such equipment, it is highly desirable to connect the lead wires and multiconductor cable to contact elements along one edge of a printed circuit board through a common or universal electrical connector.

In the prior art, single purpose electrical connectors have been provided for connecting a plurality of conductors in a flexible multiconductor flat cable to a corresponding plurality of contact elements on each side of one edge of a printed circuit board. Such prior art electrical connectors generally comprise an insulating body member having an elongated cavity and a unitary spring clip having a plurality of resilient fingers corresponding in number and spacing with the contacts on the board. The plurality of fingers are disposed in the cavity of the insulating body and are dimensioned to receive a folded portion of the flat cable and the printed circuit board which is interposed between the folded portion, whereby the resilient fingers urge the plurality of conductors in the multiconductor cable to the corresponding electrical contact elements on the printed circuit board to make the desired contact. Such connectors did not have provision for connecting lead wires to corresponding contact elements on the same edge of the printed circuit board.

Although prior art electrical connectors have been satisfactory for the purpose intended, such connectors are unsatisfactory for connecting lead wires and flexible multiconductor cables to corresponding contact elements disposed on the same edge of a printed circuit board. The unitary spring clip and flexible cable not only prohibited the connecting of lead wires to a contact element on the same edge of the printed circuit board, but also made it difficult to design circuits and associated electrical contact elements on the printed circuit board for lead wires and multiconductor cables.

Further, the method of fabricating prior electrical connectors for printed circuit boards was such that electrical connectors could not be readily changed or fabricated with off-the-shelf components into any desired combination to form a basic unit. For example, each connector would have a specially designed body member of insulating material for each connecting problem involved.

In accordance with this invention, provision is made for a new and useful universal printed circuit board electrical connector primarily useful for connecting multiconductor coplanar cables and lead wires thereto. The electrical connector, while primarily useful for lead wires and a flat cable, may be used as a single purpose connector for lead wires and printed circuit boards or for only flexible multiconductor flat cables and printed circuit boards.

Accordingly, it is an object of the present invention to provide a novel and useful electrical connector for printed circuit boards which is simple, relatively easy and economical to make, and which may be used as a common connector for lead wires and multiconductor flat cables for printed circuit boards.

It is an other object of the present invention to provide an electrical connector in which the means for connecting the lead wires to the contact elements on the printed circuit board and the means for connecting the multiconductor flat cable to the contact elements on the printed circuit board are interchangeable and firmly held in the connector by a simple structural arrangement.

A further object of the present invention is to provide an electrical connector which is readily changeable to accommodate various cable widths and a plurality of lead wires.

It is yet another object of the present invention to provide an electrical connector for connecting lead wires and a plurality of conductors on a flexible flat multiconductor cable to corresponding contact elements on the same edge of a printed circuit board.

It is another object of the present invention to provide a method for assembiying an electrical connector which results in the production of an inexpensive electrical connector.

It is still a further object of the present invention to provide a novel method for making a printed circuit board electrical connection which obviates the above described disadvantages of the prior art.

In accordance with the present invention, the foregoing and other objects are realized by an electrical connector which embodies a plurality of insulated individual contact means having diametrically opposed resilient contact elements for receiving and retaining a flexible multiconductor cable and one edge of a printed circuit board therebetween. The multiconductor cable has a plurality of conductors corresponding to the contact elements on the edge of the printed circuit board. Further included are second insulated individual contact means each having a contact portion of spring-like construction to efficiently contact selected ones of the contact elements on the edge of the printed circuit board. Also included are a body member and mounting means on the body member for interchangeably and detachably mounting selected ones of the first and second individual contact means to contact selected contact elements on the same edge of the printed circuit board. The first and second contact means are interchangeable in the body member. The second individual contact means includes means for electrically connecting lead wires thereto.

The method for fabricating the electrical connector includes the steps of providing as by forming a plurality of first individual insulated contact means having diametrically opposed contact portions and a plurality of second individual insulated contact means having a contact portion of spring-like construction to efficiently contact selected ones of the contact elements on the edge of the printed circuit board. Further included are the steps of selectively positioning the first and second individual contact means in cooperative relationship with the corresponding contact elements on the edge of the printed circuit board and clamping to a body member the first and second individual contact means in the cooperating position.

In accordance with another object of the invention, the flexible cable may be perforated so that the selected ones of the first and second insulated contact means may make contact with the printed circuit board through the flexible cable.

The principles of this invention will become apparent by referring to the specific embodiment described in the following specification and shown in the accompanying drawing, in which.

Figures 1, 2, 3, 4:
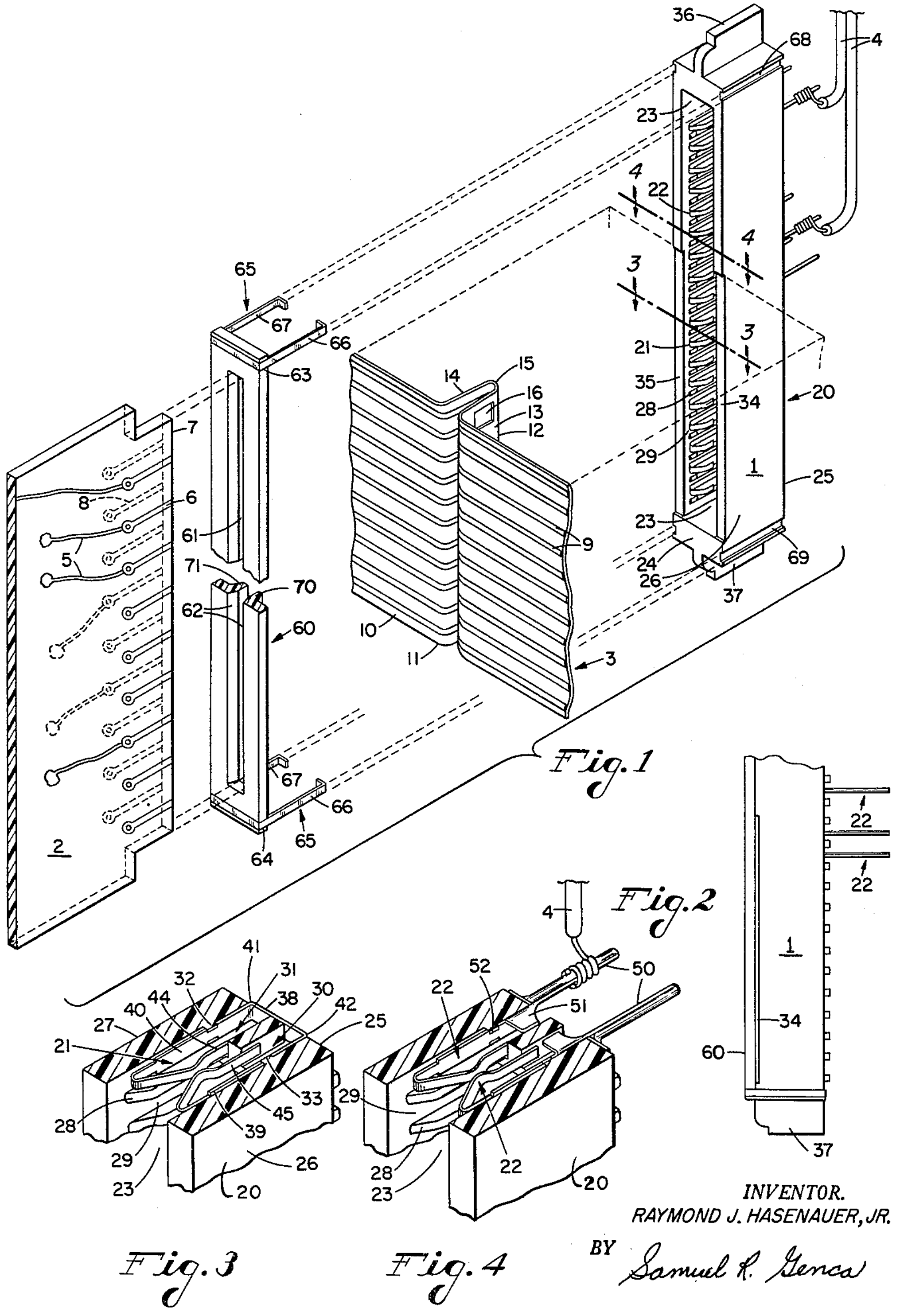
FIG. 1 is a perspective view of an assembly comprised of a connector in accordance with the present invention, the various parts of the assembly being illustrated in disassembled relationship.
FIG. 2 is a fragmentary side view of the electrical connector shown in FIG. 1.
FIG. 3 is a perspective view in cross-section substantially on line 3—3 of the connector in FIG. 1 showing a contact clip in position within the body member.
FIG. 4 is a view similar to that in FIG. 3 showing a pair of contact springs which ar einterchangeable with the contact clip shown in FIG. 3.

Referring now to FIG. 1 of the drawing in detail, there is shown generally at 1 an electrical connector, in accordance with the present invention, intended in the preferred embodiment to be used with such a printed circuit board shown generally at 2, a flexible coplanar multiconductor cable 3, and lead wires 4. The printed circuit board 2 includes conducting paths 5 terminating at electrical contact elements 6 along a leading edge 7 of the board 2. The contact elements 6 conventionally may be placed uniformly along the length of the edge 7 to correspond with similarly uniformly spaced contact clips and pairs of contact springs in the electrical connector 1 and similarly uniformly spaced conductors on the multiconductor flat cable 3. As is well known, printed circuit boards may have circuits on each side of the board 2, in which case the contact elements 8 are provided with similar spacing as contact elements 6.

The flexible multiconductor cable 3 includes a plurality of flexible conductors 9 which are adherent on a face 10 of a non-rigid insulating strip 11, such as a polyester insulating film. As was mentioned above, the conductors 9 are uniformly spaced corresponding to the mating electrical contact element 6 and 8 on the printed circuit board leading edge 7 and the contact clips 21 and pairs of contact springs 22 in the electrical connector 1. The multiconductor cable 3 includes a folded section 12 having opposed right and left side portions 13 and 14, respectively, in a face-to-face relation connected by a cable bight portion 15. The folded section 12 is substantially normal to the longitudinal axis of the cable 3. The right and left side portions 13 and 14 have a width substantially equal to the length of the contact elements 6 and 8 for receiving therebetween a substantial portion of the contact elements 6 and 8 to thereby insure a good electrical contact between corresponding opposing conductor 9 on face 10. Shown at 16 is an opening through the right side portion 13. The opening 16 wil be described more in detail with the contact clips 21 and contact springs 22 in the connector 1.

The electrical connector shown generally at 1 comprises an elongated body member 20 of insulating material adapted to hold a plurality of U-shaped contact clips 21 and a plurality of interchangeable contact springs 22 in a row within an elongated cavity 23. The elongated body member 20 has a proximal face 24 and a distal face 25. The cavity 23 is disposed in the proximal face 24 of the body member 20. The cavity 23 coresponds in length with the printed circuit board leading edge 7 so that the leading edge 7 just fits within the cavity 23 and is properly positioned lengthwise within the cavity 23 so that the U-shaped contact clips 21 and the pairs of interchangeable contact springs 22 are in alignment with the corresponding contact elements 6 and 8 on the leading edge 7 of printed circuit board 2. The body member 20 includes connector right and left side walls 26 and 27, respectively, longitudinally defining elongated cavity 23. The right and left side walls 26 and 27, respectively, each include inwardly extending and spaced ribs 28 with grooves 29 extending into body member 20. The ribs 28 and grooves 29 are illustrated more in detail in FIGS. 3 and 4. The grooves 29 extend into the body member 20 from the proximal face slightly more than the width of the right and left side cable portions 13 and 14 of the folded section 12. Communicating with the grooves 29 and the distal face 25 of the body member 20 are similarly dimensioned right and left contact clip holes 30 and 31, respectively, adapted to interchangeable receive the U-shaped contact clips 21 and the interchangeable contact springs 22. The holes 30 and 31 are arranged in a first and second row, respectively, in the body member 20 to receive individually the interchangeable contact springs 22 and the U-shaped contact clips 21 in a pair of opposing contact clip holes 30 and 31. Interposed between the end of the grooves 29 and the start of the contact clip holes 30 and 31 are a pair of right and left corner projections 32 and 33, respectively, substantially normal to the grooves 29. The right and left corner projections 32 and 33 are the means for releasably mounting the U-shaped contact clips 21 and the interchangeable contact springs 22 in the body member 13 and will be discussed more in detail with the contact clips 21 and contact springs 22. In accordance with the present invention, all the grooves 29 and contact clip holes 30 and 31 are similarly dimensioned so that the U-shaped contact clips 21 and contact springs 22 may be interchangeably and selectively positioned within the body member 13.

The cavity 23 is adapted to receive the folded section 12 of the cable 3 and the printed circuit board edge 7. The body member 20 includes a right and left recessed portion 34 and 35 on the proximal face 24 adapted to receive and position the multiconductor coplanar cable along the length of the elongated body member 20 so that the conductors 9 of the cable 3 are in alignment with corresponding grooves 29 and the corresponding contact clips 21 and pairs of contact springs 22.

Upper and lower mounting tangs 36 and 37, respectively, may be provided at each end of the body member 20 so that it may be mounted in a cell of the type shown in copending application Serial No. 138,516, filed September 15, 1961, now Patent No. 3,098,177, and assigned to the same assignee as the present invention. The upper and lower mounting tangs 36 and 37, respectively, form no part of this invention and it should be understood that mounting holes may be provided at each end of the body member 20 so that the connector 1 may be mounted by means of screws to a conventional support, as is well understood in the art.

The U-shaped contact spring 21 and the interchangeable contact clip 22 may be desirably made of beryllium copper fabricated into the figures shown in FIGS. 3 and 4, respectively. The U-shaped contact clip 21 includes a bridge member 38, a pair of forwardly extending right and left leg strips 39 and 40 connected to the bridge member 38 by bight portions 41 and 42, respectively. The forwardly extending leg strips 39 and 40 are slightly biased outwardly from a direction normal to the bridge member 38. The right and left leg strips 39 and 40, respectively, each include a pair of notches which coact with the right and left corner projections 32 and 33, respectively, to latch and properly position the U-shaped contact clip 21 within the cavity 23. The right and left leg strips 40 and 41 are bent at the ends into opposing contact elements 44 and 45 and are dimensioned to receive the folded portion 12 and printed circuit board edge 7 positionable therebetween. The opposing contact elements 44 and 45 extend into holes 31 and 32 and coact with the sides of the holes to resiliently hold the notches 43 of the right and left leg strips 39 and 40 against the right and left corner projections 32 and 33, respectively.

The interchangeable contact spring 22 which may be employed in pairs includes a straight shank portion 50 having substantially square corners for wire wrapping lead wires, such as lead wires 4, as illustrated in FIG. 4, in a manner well known in the art. Disposed along the length of the shank portion 50 are stabilizing arm 51 and a pair of notches 52, which are similar to notches on the leg strips 39 and 40 of U-shaped contact clip 21. The shank portion 50 is bent at the end into a resilient contact element substantially similar to the opposing contact elements 44 and 45 of U-shaped contact clip 21. The resilient contact element extends into the particular hole occupied by the contact spring 22. The resilient contact element being slightly biased outwardly urges the pair of notches 52 against the corresponding coacting corner projections 32 or 33.

The U-shaped contact clip 21 and the interchangeable contact spring 22, as described above, are well known in the art, taken singly, and are often referred to as "push-to-lock" terminal clips. However, in accordance with the invention, the U-shaped contact clip 21 and pairs of contact springs 22 may be selectively positioned in any of the similarly dimensioned holes 30 and 31 in the body member 20, making the connector universal in nature since lead wires and multiconductor flat cables may be connected to the same leading edge 7 of the printed circuit board 2 through a common connector.

The connector 1 further includes a means for clamping the folded portion 12 of the multiconductor flexible flat cable 3 within the cavity 23. The means includes a cover plate 60 and retaining clips 65. The cover plate 60 includes an elongated slot 61 having beveled edges 62. The conductor 9 on cable 3 may bridge the opening 16 for connecting the contact clip 21 or contact spring 22 to conductor 9 and a contact element 6 or 8 on the printed circuit board 2. The slot 61 corresponds in length with the printed circuit board leading edge 7 and cavity 23 so that the leading edge 7 just fits within the slot 61 and is properly positioned lengthwise within the cavity 23 so that the corresponding U-shaped contact clips 21 and the corresponding pairs of interchangeable contact springs 22 are in alignment with the corresponding contact elements 6 and 8 on the printed circuit board 2. Shown on the diametrically opposite ends of the cover plate 60 are upper and lower retaining grooves 63 and 64, respectively, for aligning the cover plate 60 relative to body member 20. For this purpose, two retaining clips 65 are provided. The retaining clips 65 are U-shaped having forwardly extending resilient arms 66 and 67 which embrace the connector body member 20. The forwardly extending arms 66 and 67 are bent at their ends to retain the cover plate 65 to the body member 20 once they have passed the distal face 25. Upper and lower grooves 68 and 69 are provided on the body member 20 to align the cover plate 60 with the body member 20. The cover plate 60 includes wedges 70 and 71 along both sides of the slot 61. The wedges 70 and 71 not only clamp the cable 3 against the right and left side walls but also provide additional thickness for the cover plate 60. The additional thickness adds rigidity to the cover plate and bearing surface for the printed circuit board 2.

FIG. 2 illustrates the connector 1 in the assembled state showing only a fragment of the lower part of the connector 1. The recess 34 has a depth slightly less than the thickness of the cable 3 to insure clamping action on the cable 3. Attention is directed now to the position of the U-shaped contact clips 21 and interchangeable contact springs 22 relative to the cable 3. The contact springs 22 may be disposed in the region of the cable 3 and still make contact with the printed circuit board in accordance with the invention. For this purpose, the cable 3 includes opening 16 positioned in cooperative relationship with contact elements 6 and 8 on the printed circuit board edge 7. Thus, electrical contact may be made directly through cable 3 to the contact elements 6 and 8 on the printed circuit board edge 7 by contact clips 21 or contact springs 22.

In assembling to make the connector 1, the U-shaped contact clips 21 are inserted from the distal face 25 of the connector body 20. The leg strips 39 and 40 are selectively inserted in a pair of opposing holes 30 and 31, respectively, until stopped by the corner projections 32 and 33. The leg strips 39 and 40 are then urged inwardly to bypass the corner projections 32 and 33. The U-shaped contact clip 21 is then pushed into the body member 20 until the notches on leg strips 39 and 40 engage the corner projections 32 and 33, respectively.

In a somewhat similar manner, the interchangeable contact springs 22 are inserted from the distal face 25 of the connector body 20 into one of the selected holes 30 or 31 adapted to receive the contact clips 21 and contact springs 22. The contact spring 22 is pushed inwardly into the body member 20 until stopped by the corner projection 32. To bypass the corner projection 32, the shank 50 is moved outwardly permitting the contact element of the contact clip to bypass the corner projection 32. The contact spring 22 is then pushed into the body member 20 until the pair of notches 52 engage the corner projection 32.

The U-shaped contact clips 21 and the interchangeable contact springs 22 are now in position to receive the folded portion 12 of the cable 3. The folded portion 12 is inserted into the cavity 23 and positioned in the recessed portions 34 and 35 of the body member 20.

The cover plate 60 is then placed over the cable 3 and is brought into alignment with the body member 20. The cover plate 60 is secured to the body member 20 with two retaining clips 65. The printed circuit board may now be plugged into the connector 1 by inserting the leading edge 7 into the slot 61.

In operation, the printed circuit board leading edge 7 is inserted into the slot 61 in the cover plate 60 and pushed into the cavity 23 of the body member 20. The flexible cable 3 in FIG. 1 has a smooth curved folded section 12 which helps to guide the printed circuit board 2 into the connector 1. Contact clips 21 and the pairs of contact springs 22 normally maintain a pressure on the conductors 9 on the cable 3 and the contact elements 6 and 8 on the printed circuit board 2. This pressure causes the contact elements 6 and 8 to wipe the contact clips 21 and the pairs of contact springs 22 so as to remove any oxidation or foreign matter formed on the contact clips 21 or the pairs of contact springs 22 and the contact elements 6 and 8. The remaining contact clips 21 and the pairs of contact springs 22 not covered by the flexible cable 3 make contact directly with the contact elements 6 and 8 on the printed circuit board 2.

From the foregoing, it is seen that the electrical connector facilitates electrical connection between the contact elements on the leading edge 7 of a printed circuit board 2 and corresponding conductors on a flexible flat cable and lead wires 4. Many electrical contact combinations may be made between the printed circuit board 2 and the flexible flat cable 3 together with contact clips 21 and contact springs 22. For example, clips 21 or contact springs 22 may be connected to selected ones with terminals 6 and 8 by providing selected opening 16 in the cable 3. On the other hand, if only clips 21 are used with flexible cable 3 without opening 16, terminals 6 and 8 may be interconnected by conductor 9. If contact springs 22 are used in the lower section of opening 16, the leads 4 may be connected directly to the printed circuit board.

While there has been disclosed what is at present considered to be the preferred embodiment of the invention, modifications thereto will readily occur to those skilled in the art. For example, it will now be obvious to those skilled in the art that the individual U-shaped contact clips and the contact springs 22 may be mounted in individual first and second insulated modules, respectively, and rigidly secured to a structural body member in preselected relative positions. Suitable end pieces may be provided for mounting the assembled first and second modules to a support member in any convenient method well known to those skilled in the art. Further modifications may be incorporated by providing tie-bolt holes in the first and second modules and assembling the first and second modules on the tie-bolts. These features, of course, permit any desired combinations to be built with off-the-shelf electrical modules into a desired electrical connector.

While there has been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. An electrical connector comprising, in combination, a printed circuit board having a plurality of electrical contact elements spaced apart a given distance along one face thereon and terminating near one edge thereof, a flat flexible longitudinal cable having a folded portion transverse to the longitudinal axis thereof for receiving said one edge of said printed circuit board, said flat cable having a plurality of exposed coplanar conductors in said folded portion corresponding to selected ones of said contact elements on said printed circuit board, a body member including a cavity on a proximal face thereon for supporting said folded portion of said cable and said printed circuit board therebetween, means for fixing said folded portion of said flat cable to said body member, a first plurality of insulated individual contact clips detachably mounted in said cavity of said body member in cooperative relation with said cable and said printed circuit board for yieldingly urging said longitudinal coplanar conductors in said cable to said corresponding selected ones of said contact elements on said printed circuit board whereby electrical contact is made therebetween, and a plurality of pairs of insulated contact springs detachably mounted in said cavity of said body member and interchangeable with said insulated individual contact clips for concurrently electrically contacting corresponding other ones of said contact elements on said printed circuit board.

2. The electrical connector defined in claim 1 wherein each of said pairs of contact springs include means for making an external connection to lead wires.

3. An electrical connector comprising, in combination, a printed circuit board having a plurality of electrical contact elements spaced apart a given distance along two principal faces thereon and terminating near one edge thereof, a flat flexible longitudinal cable having a folded portion transverse to the longitudinal axis thereof for slidably receiving said one edge of said printed circuit board, said flat cable having a plurality of exposed coplanar conductors in said folded portion corresponding to selected ones of said contact elements on said printed circuit board, said flat cable further including predetermined openings in said folded portion exposing other ones of said contact elements on said printed circuit board, a body member of dielectric material including a cavity on a proximal face thereon for supporting said folded portion of said cable and said printed circuit board therebetween, means for fixing said folded portion of said flat cable to said body member, a first plurality of insulated individual contact clips detachably mounted in said cavity of said body member in cooperative relation with said cable and said printed circuit board for yieldingly urging said longitudinal coplanar conductors in said cable to said corresponding ones of said contact elements on said printed circuit board whereby electrical contact is made between said corresponding ones of said contact elements and said coplanar conductors, and a plurality of pairs of contact springs detachably mounted in said cavity of said body member and interchangeable with said insulated individual contact clips for concurrently electrically contacting corresponding said other ones of said contact elements on said printed circuit board.

4. The electrical connector as set forth in claim 3 wherein a portion of said cable including a part of one of said longitudinal conductors is removed thereby producing first and second parts of said one longitudinal conductor so that said first part may be brought into mating relationship with an element on one principal face of said circuit board while the second part may be brought into mating relationship with another element on the other principal face of said printed circuit board.

5. An electrical connector comprising a body member, a plurality of insulated individual contact spring clips each having diametrically opposed resilient contact elements of finite width for receiving and yieldingly embracing two principal faces of a printed circuit board, said printed circuit board having a plurality of spaced contact elements on at least one of said principal faces thereon terminating near said one edge thereon of said contact clips, a plurality of pairs of opposed contact springs, each of said contact springs in said pairs of contact springs having a resilient contact element of finite width substantially similar to one of said diametrically opposed resilient contact elements of said spring clip for contacting corresponding ones of said contact elements on said principal face of said printed circuit board, mounting means on said body member for detachably and interchangeably mounting selected ones of said plurality of contact spring clips and said pairs of insulated contact springs in any one of a given plurality of predetermined positions in cooperative relationship with said corresponding ones of said contact elements on said printed circuit board, and a non-rigid longitudinal strip of dielectric material carrying plurality of coplanar longitudinal conductors interposed between said printed circuit board and said plurality of U-shaped contact spring clips, said plurality of coplanar conductors being mateable with selected ones of said contact elements on said printed circuit board, said contact clip yieldingly urging said plurality of coplanar longitudinal conductors to corresponding selected ones of said contact elements on said printed circuit board.

6. A system for electrically connecting concurrently a first plurality of spaced apart flexible coplanar longitudinal conductors carried on one face of a non-rigid longitudinal strip of dielectric material and a second plurality of individual lead wires to a corresponding third and fourth plurality of spaced electrical contact elements, respectively, carried by a printed circuit board near one edge thereof, said system comprising a non-rigid strip of dielectric material having a first plurality of longitudinal flexible coplanar conductors carried on a face thereof, a printed circuit board having a third and fourth plurality of electrical contact elements on one principal face thereon and terminating near one edge thereof, said strip having a folded portion transverse to the longitudinal axis thereof for slidably receiving said edge of said printed circuit board therebetween, said first plurality of longitudinal conductors being matable with said third plurality of contact elements on said printed circuit board, a body member having a cavity for supporting said folded portion of said strip and said printed circuit board therebetween, means for fixing said strip to said body member, a plurality of contact clips detachably mounted in said cavity of said body member in cooperative relationship with said first plurality of longitudinal conductors and said third plurality of contact elements on said printed circuit board, each of said contact clips being so formed that when one of said longitudinal conductors carried by said non-rigid strip is placed in mating relationship with a corresponding one of said third plurality of said contact elements on said printed circuit board that said contact clip will maintain said one of said plurality of longitudinal conductors in electrical contact with said corresponding one of said plurality of contact elements on said printed circuit board, a plurality of pairs of contact springs detachably mounted in said cavity of said body member, said pairs of contact springs being so formed and positioned in said cavity of said body member that said pairs of contact springs will concurrently make an electrical contact with said fourth plurality of said contact elements on said printed circuit board, and each of said pairs of contact springs being interchangeable with said contact clips in said body member.

7. The system set forth in claim 6 wherein said third and fourth plurality of electrical contact elements on said printed circuit board are disposed on two principal faces thereon and terminate near one edge thereof.

8. The system as set forth in claim 7 wherein a portion of said strip including a part of one of said longitudinal conductors is removed thereby producing first and second parts of said one longitudinal conductor so that said first part may be brought into mating relationship with an element on one of said principal faces of said circuit board while the second part may be brought into mating relationship with another element on the other principal face of said printed circuit board.

References Cited in the file of this patent

UNITED STATES PATENTS

| | | |
|---|---|---|
| 2,793,354 | Heimbach | May 21, 1957 |
| 2,937,357 | Kennedy | May 17, 1960 |
| 3,015,083 | Juris | Dec. 26, 1961 |
| 3,047,831 | Majewski | July 31, 1962 |
| 3,059,211 | Thomas et al. | Oct. 16, 1962 |

FOREIGN PATENTS

| | | |
|---|---|---|
| 849,078 | Great Britain | Sept. 21, 1960 |